United States Patent
Wong et al.

(10) Patent No.: US 9,778,312 B1
(45) Date of Patent: Oct. 3, 2017

(54) INTEGRATED CIRCUIT CALIBRATION SYSTEM USING GENERAL PURPOSE PROCESSORS

(71) Applicant: Altera Corporation, San Jose, CA (US)

(72) Inventors: Wai Tat Wong, Bukit Mertajam (MY); Edwin Yew Fatt Kok, Bayan Lepas (MY); Wilfred Wee Kee King, Kuching (MY); Tee Wee Tan, Bukit Mertajam (MY)

(73) Assignee: Altera Corporation, San Jose, CA (US)

( * ) Notice: Subject to any disclaimer, the term of this patent is extended or adjusted under 35 U.S.C. 154(b) by 840 days.

(21) Appl. No.: 14/055,459

(22) Filed: Oct. 16, 2013

(51) Int. Cl.
 *G01R 31/28* (2006.01)
(52) U.S. Cl.
 CPC ................................ *G01R 31/2851* (2013.01)
(58) Field of Classification Search
 USPC ........................................................ 702/107
 See application file for complete search history.

(56) References Cited

U.S. PATENT DOCUMENTS

| 8,669,799 | B1* | 3/2014 | King | H03K 5/1565 |
| | | | | 327/172 |
| 2013/0128124 | A1 | 5/2013 | Suzuki et al. | |
| 2013/0210411 | A1* | 8/2013 | Ojha | H04W 24/00 |
| | | | | 455/418 |

FOREIGN PATENT DOCUMENTS

WO   2013101225   7/2013

OTHER PUBLICATIONS

Philips Semiconductors, application note for P82C150, serial Link I/O device, AN94088, 52 pages, Dec. 20, 1994.*

* cited by examiner

*Primary Examiner* — Tung Lau
(74) *Attorney, Agent, or Firm* — Joseph F. Guihan

(57) ABSTRACT

In one embodiment, an integrated circuit is disclosed. The integrated includes a general purpose processor, an interface circuit, and a calibration adapter circuit. The general purpose processor circuit generates calibration test inputs based on user instruction. The analog interface circuit may include a calibration bus circuit. The calibration bus circuit may receive the calibration test input from the general purpose processor circuit. The calibration adapter circuit is coupled to the calibration bus circuit and the general purpose processor circuit and transmits the calibration test inputs to the calibration bus circuit.

12 Claims, 7 Drawing Sheets

INTEGRATED CIRCUIT CALIBRATION SYSTEM USING GENERAL PURPOSE PROCESSORS

BACKGROUND

An integrated circuit may include analog circuits that provide a variety of functions. For example, such analog circuits may be used for transferring signals between the integrated circuit and an external circuit. Designing high speed analog circuits using the latest semiconductor fabrication technology (e.g., a 20 nanometer process node) is challenging and expensive. Furthermore, high speed analog circuits may have a low tolerance to various sources of variation such as process variation, temperature variation, and power supply variation.

Oftentimes, an analog circuit may be calibrated using calibration circuitry to reduce or eliminate any adverse effect on the circuit performance that may arise due to the various sources of variations.

However, the calibration circuitry may need to be redesigned when the integrated circuit shifts from one semiconductor process node to another. Furthermore, the functionality of the calibration circuitry cannot be altered once the integrated circuit has been manufactured. These problems may impose significant limitations on the design and manufacturing of calibration circuitry on an integrated circuit device.

It is within this context that the embodiments described herein arise.

SUMMARY

Embodiments described herein relate to an integrated circuit calibration system using a general purpose processor and methods of operating the calibration system. It should be appreciated that the embodiments can be implemented in numerous ways, such as a process, an apparatus, a system, or a device. Several embodiments are described below.

In one embodiment, a calibration system that is implemented on an integrated circuit is disclosed. The calibration system includes a general purpose processor for calibrating analog circuits. The calibration system designs may be ported from one semiconductor process to another semiconductor process. Furthermore, the calibration system may easily produce different calibration signals. The calibration system allows for expansion of its functions (e.g., expansion to include other calibration mechanisms) by being coupled to various other circuits on the integrated circuit.

In another embodiment, an integrated circuit with a general purpose processor circuit and an analog interface circuit is disclosed. The general purpose processor circuit may generate a test input after receiving an instruction to perform calibration. The analog interface circuit may receive the test input from the general purpose processor and may accordingly generate a corresponding test output.

In another embodiment, an integrated circuit with a general purpose processor circuit and an analog interface circuit is disclosed. The general purpose processor circuit may generate a calibration test input. The analog interface circuit may include a calibration bus circuit. The calibration bus circuit may receive the calibration test input from the general purpose processor circuit to test the analog interface circuit.

In an alternative embodiment, an integrated circuit having a general purpose processor circuit, an analog interface circuit and a sub-system circuit is disclosed. The general purpose processor circuit may generate test inputs based on a user instruction to calibrate the analog interface circuit. The analog interface circuit may further include a calibration bus circuit. The calibration bus circuit receives the calibration test input from the general purpose processor circuit to test the analog interface circuit. The sub-system circuit, which may be coupled to the calibration bus circuit and the general purpose processor circuit, may be utilized to transmit the test inputs to the calibration bus circuit.

In one embodiment, a method of calibrating an analog interface circuit with a non-reconfigurable general purpose processor is disclosed. The method may include a step to receive a calibration instruction by the general purpose processor. The method may also include a step to calibrate the analog interface circuit. Furthermore, the method may include a step to receive the calibration outputs generated by the analog interface circuit by the general purpose processor. And, finally, the method may include a step to compare the calibration outputs to expected calibration outputs.

Further features of the invention, its nature and various advantages will be more apparent from the accompanying drawings and the following detailed description of the preferred embodiments.

DETAILED DESCRIPTION

The following embodiments describe an integrated circuit calibration system using a general purpose processor and a method to operate the calibration system. It will be obvious, however, to one skilled in the art, that the present exemplary embodiments may be practiced without some or all of these specific details. In other instances, well-known operations have not been described in detail in order not to unnecessarily obscure the present embodiments.

Typically, the design of the calibration circuitry that is included on an integrated circuit cannot be altered once the integrated circuit has been manufactured. However, the calibration circuitry may need to be redesigned when the manufacturing of an integrated circuit is moved from one semiconductor process node to another. The embodiments described herein can be advantageously used for calibrating analog circuits, such that the calibration circuitry does not have to be redesigned when the integrated circuit is manufactured on different processes or process nodes.

Figure 1:
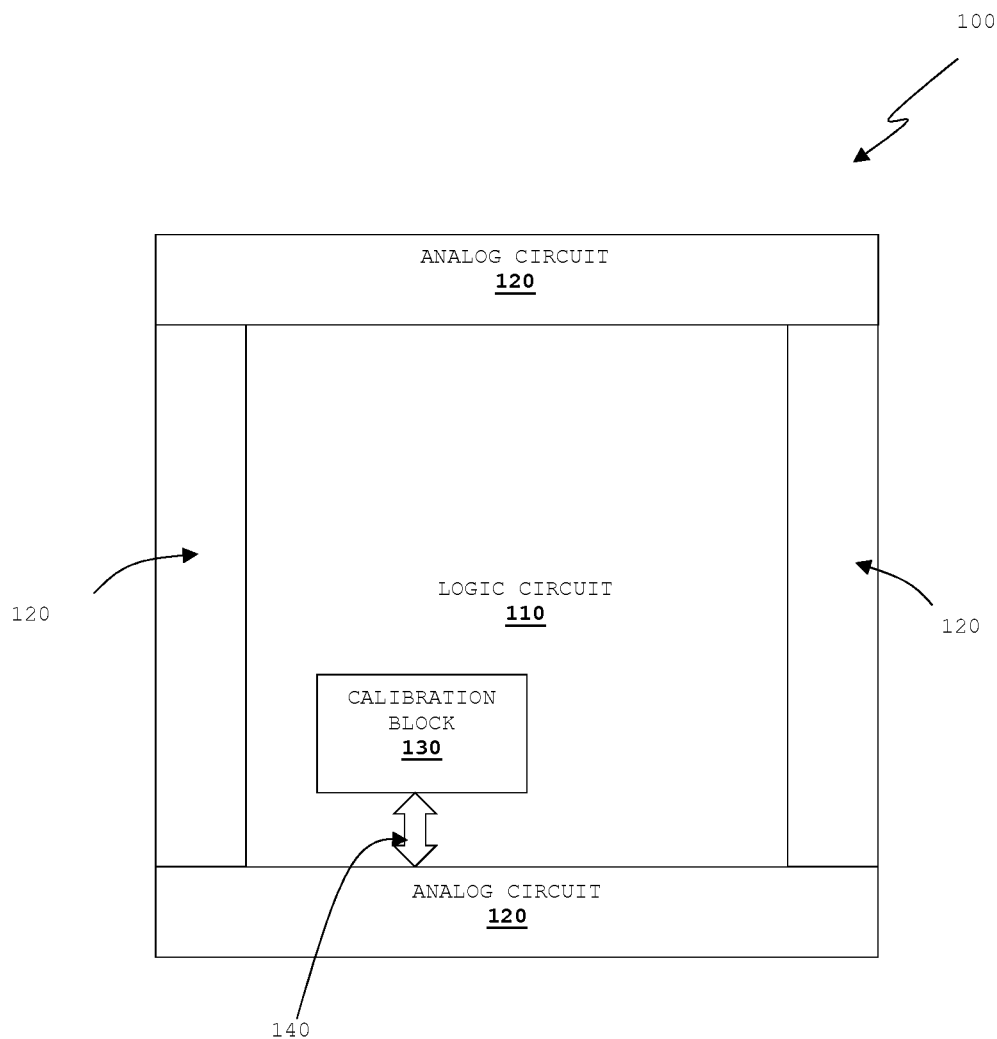
FIG. 1 shows an illustrative integrated circuit in accordance with one embodiment of the present invention.

FIG. 1, meant to be illustrative and not limiting, illustrates an integrated circuit (IC) in accordance with one embodiment of present invention. Integrated circuit 100 includes a plurality of analog circuits 120 and logic circuit 110. Integrated circuit 100 may be an application specific integrated circuit (ASIC) device or an application specific standard product (ASSP) device (e.g., memory devices or microprocessor devices). Alternatively, integrated circuit 100 may be a programmable logic device (PLD) such as a field programmable gate array (FPGA) device.

In FIG. 1, analog circuits 120 may be located at peripheral regions of integrated circuit 100 whereas logic circuit 110 may be located in the center region of integrated circuit 100. However, it should be appreciated that logic circuit 110 and analog circuits 120 may be arranged differently on integrated circuit 100 without departing from the scope and spirit of the present invention.

Embodiments of the integrated circuit 100 may be utilized to meet different high speed telecommunications needs. In one embodiment, integrated circuit 100 may be used in wireless radio frequency (RF) communications systems. When used in such systems, integrated circuit 100 may transfer signals across different transmission channels. Alternatively, integrated circuit 100 may be utilized in a wireline communications system.

Logic circuit 110 may perform the core functions of integrated circuit 100. It should be appreciated that the functions of logic circuit 110 may depend on a user design or what type of circuit integrated circuit 100 is. For example, logic circuit 110 may be utilized for signal processing when integrated circuit 100 is a microprocessor device. Alternatively, logic circuit 110 may be utilized for data storage when integrated circuit 100 is a memory device.

In one embodiment, logic circuit 110 may include programmable logic elements. The programmable logic elements may be configurable to perform various functions. Furthermore, logic circuit 110 may also include memory modules (e.g., random access memory (RAM) modules), Joint Test Action Group (JTAG) interface module, and clock management modules. It should be appreciated that logic circuit 110 may be formed mainly from a plurality of digital circuits (e.g., AND gates, NOR gates, registers, etc.). Therefore, logic circuit 110 may receive digital input signal with different logic states (e.g., logic state '1' or logic state '0') and may accordingly output digital signals.

Conversely, analog circuits 120 may include circuits that receive and transmit analog signals. For instance, analog circuits 120 may receive an input signal that varies gradually with time. Similarly, analog circuits 120 may output an analog output signal that varies gradually with time. In one instance, analog circuits 120 may be designed to receive one or more analog signals, and may process the received signals by performing specific functions such as amplification, attenuation, filtering, integration, addition and subtraction. These functions may dictate the topology of analog circuits 120.

Analog circuits 120 may be more sensitive to noise compared to digital circuits (e.g., logic circuit 110). It should be appreciated that the noise sensitivity of a circuit may be reflected by its signal-to-noise ratio (SNR). A circuit with a low SNR value may be more sensitive to noise compared to a circuit with a high SNR value. Analog circuits 120, in general, may have a relatively lower SNR value compared to logic circuit 110. Hence, even the smallest variation in either the manufacturing process or the device temperature, may affect the performance of analog circuits 120. Digital circuits, in contrast, are generally less sensitive to noise. Hence, the performance of a digital circuit may be relatively more stable even when there are variations in the manufacturing process and the device temperature.

In one embodiment, analog circuits 120 may include transceiver circuits. Such implementation may be common when integrated circuit 100 is utilized for high speed communication. Hence, analog circuits 120 may transmit signals out of integrated circuit 100 or receive signals transmitted to integrated circuit 100. An analog circuit such as any one of analog circuits 120 may be coupled to an input/output (I/O) pin (not shown) which may in turn be coupled to external circuits (also not shown). Therefore, in one instance, analog circuits 120 may also be known as interfacing circuitry on integrated circuit 100.

In one embodiment, analog circuits 120 may be programmable analog circuits that are configured to process different types of signals. For example, analog circuits 120 may be configured according to an I/O standard, such as the low-voltage differential signaling (LVDS) standard or the differential high speed transceiver logic (HSTL) standard.

Analog circuits 120 may generally include other circuits such as amplifiers, analog-to-digital (A2D) converters, digital-to-analog (D2A) converters or delay elements. In one embodiment, analog circuits 120 may include circuits such as those shown in analog circuits 120 of FIGS. 2-6. Even though specific circuits are shown in analog circuits 120 in the embodiments of FIGS. 2-6, it should be appreciated that other circuits may be formed in an analog circuit such as analog circuit 120 without departing from the scope and spirit of the present invention.

The output of analog circuits 120 may vary with process, temperature or power supply. In some instances, the variations described above may affect the entire functionality of integrated circuit 100. For example, analog circuits 120 used as a reference voltage circuit (i.e., a circuit that generates a reference voltage for other circuits on integrated circuit 100) may affect the functionality of the circuits that depend on them when there are variations either in the manufacturing process, temperature, or power supply. This may cause unwanted errors during operation of integrated circuit 100.

Referring to FIG. 1, the IC 100 includes a calibration block 130 that generates signals for calibrating analog circuits 120, in accordance with one embodiment. The calibration block 130 can be implemented as part of the logic circuit 110. Furthermore, calibration block 130 may provide calibration offsets to analog circuits 120 (i.e., adjustments made to the signals transmitted within analog circuits 120). The calibration offsets may calibrate the analog circuit 120 to compensate for process, voltage and temperature variations so that the performance of analog circuits 120 does not get any impact. It should be appreciated that calibration offsets may be used to reduce or eliminate various offsets, for example, timing offsets, phase offsets, amplitude offsets and voltage offsets, in output signals from analog circuits 120.

Calibration block 130 may implement a number of calibration techniques for performing calibration operations on analog circuits 120. It should be appreciated that there are many different types of calibration (e.g., adaptive calibration and automated calibration). Each calibration operation may generate a different calibration offset. In one instance, the calibration operation performed by calibration block 130 may be an incremental calibration operation where the value of the calibration signal is increased in small steps until a desired the signal value is obtained in either of analog circuits 120. It should be appreciated that a user or circuit designer typically evaluates the advantages and disadvantages of the various calibration techniques for a given application and selects a particular calibration technique to be used for calibrating analog circuits 120 using calibration block 130.

In one embodiment, calibration block 130 may be formed with programmable logic circuits (e.g., look-up-tables (LUTs), programmable interconnects, registers and other circuitries on integrated circuit 100). Alternatively, calibration block 130 may be formed with fixed-function circuits (e.g., arithmetic logic unit, fixed interconnects, etc.). In other embodiments, the calibration block 130 can be implemented using a programmable processor or microcontroller that is programmed to execute instructions that implement the calibration techniques. Details of calibration block 130 may be further shown and described with reference to FIGS. 2-6.

Calibration block 130 may transmit calibration test inputs to analog circuits 120 and may receive calibration test outputs from analog circuits 120. The calibration test inputs and outputs are transmitted between calibration block 130 and analog circuits 120 through a plurality of interconnects 140. In one instance, interconnects 140 may be programmable interconnects that is configured to route the calibration test inputs from calibration block 130 to analog circuits 120 and to route the calibration test outputs from analog circuits 120 to calibration block 130. Interconnects 140 may be a part of the global interconnects in integrated circuit 100 (e.g., interconnects that are coupled across a large number of circuits within integrated circuit 100) or a part of the local interconnects (e.g., interconnects that couple a small number of circuits within integrated circuit 100). It should be appreciated that interconnects 140 may include other circuits, such as, drivers, tri-state buffers and pass gates.

It is note that even though the embodiment of FIG. 1 shows one calibration block 130 that is used to calibrate all analog circuits 120 within integrated circuit 100, alternative embodiments (not shown) can have more than one calibration block 130. The calibration test inputs and outputs may be transmitted to respective analog circuits 120 coupled to the calibration block 130 via different paths and circuit elements, as shown in the embodiments of FIGS. 2-6.

Figure 2:
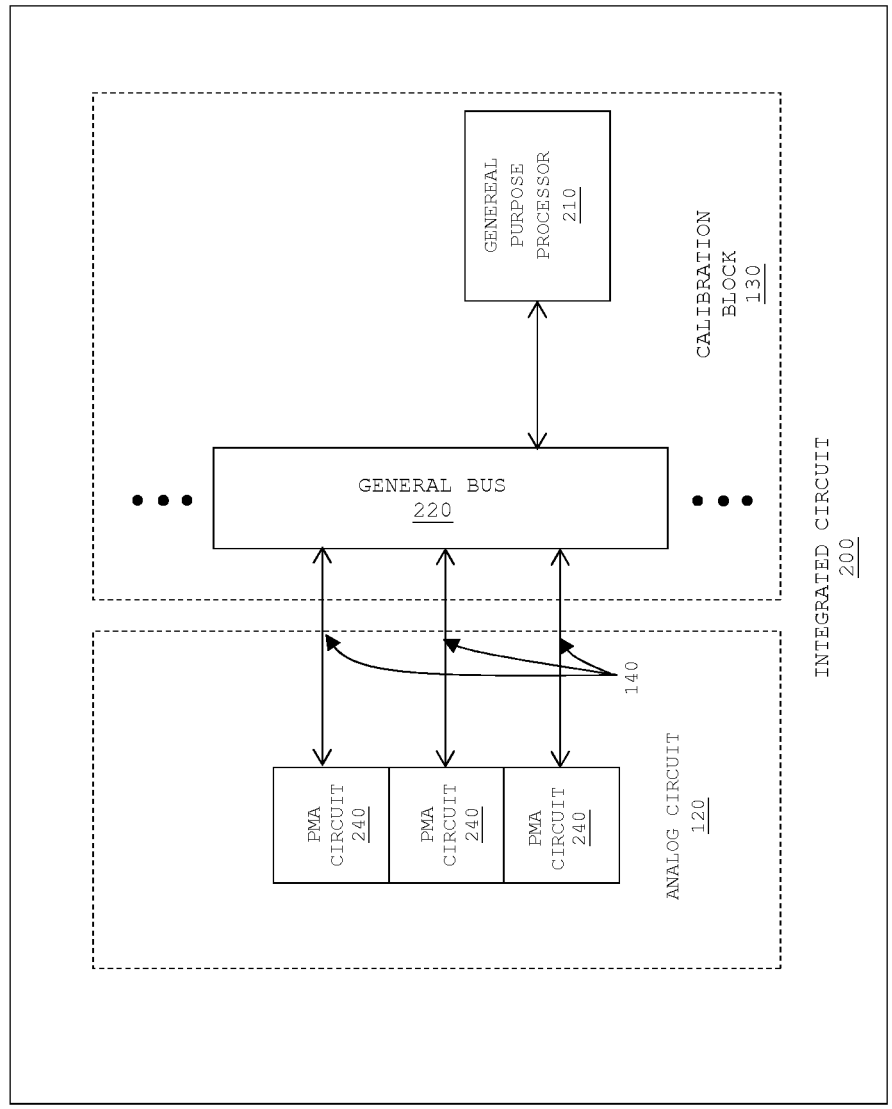
FIGS. 2-3 show two different implementations of an illustrative calibration system on an integrated circuit in accordance with one embodiment of the present invention.

FIG. 2, meant to be illustrative and not limiting, depicts an implementation of a calibration system on an integrated circuit in accordance with one embodiment of the present invention. Integrated circuit 200 may be similar to integrated circuit 100 of FIG. 1. Therefore, specific details of integrated circuit 200 that have already been described in FIG. 1 will not be repeated. In FIG. 2, calibration block 130 includes general purpose processor 210 and general bus 220. Analog circuit 120 includes a plurality of physical medium attachment (PMA) circuits 240.

In one embodiment, calibration block 130 may include a general purpose processor 210 that generates calibration test inputs after receiving a calibration instruction from a user. The calibration instruction may include computer code to command general purpose processor 210 to perform processing task. Furthermore, the calibration instruction may also a trigger signal (e.g., a pulse signal) at the beginning of the calibration process. Calibration test inputs may include control signals and calibration signals. The control signals may be utilized to setup a targeted sub-circuit in analog circuit 120 (e.g., one of PMA circuits 240) for calibration. The control signal may further include address signals that are used to identify the targeted sub-circuit and route the calibration signals to the targeted sub-circuit. The calibration signals may be used to calibrate the analog circuit 120 or the targeted sub-circuit of the analog circuit 120.

General purpose processor 210 may also process calibration test outputs from analog circuit 120 after the calibration of analog circuits 120. General purpose processor 210 processes the received calibration test outputs by comparing the calibration test outputs to expected test output values for the targeted analog circuit 120. In one instance, the expected test output values may also be received from a user. The result of the comparison may be provided to the user so that the user may determine whether the calibration needs to be adjusted or whether analog circuit 120 has been successfully calibrated. Alternatively, the calibration can be performed automatically, where the received calibration test outputs are compared to the expected test output values, and the calibration of the analog circuit 120 is adjusted automatically based on a predetermined calibration technique without further input from a user.

General purpose processor 210 may be referred to as a central processing unit (CPU) or an information processing unit. General purpose processor 210 may execute instructions (e.g., computer code written in different programming languages such as C and C++) received from the user. General purpose processor 210 may execute single-threaded instructions and/or multi-threaded instructions. In one embodiment, general purpose processor 210 may be a microprocessor module. Alternatively, general purpose processor 210 may be a microcontroller module. It should be appreciated that the microprocessor module and the microcontroller module have a number of differences. For example, a microprocessor module may include peripheral circuitry that includes a program memory module, a random access memory (RAM) module and input/output (I/O) modules that are coupled to the microprocessor module through a bus circuit. A microcontroller module, on the other hand, may include the above described peripheral circuitry (e.g., program memory module, RAM memory module and input/outputs (I/Os) module) within the microcontroller module and may not need a bus circuit for coupling purposes.

In one instance, general purpose processor 210 may include a standard processor architecture. For example, general purpose processor 210 may include an architecture similar to the NIOS II processor architecture or ARM processor architecture. It should be appreciated that the abovementioned architectures are reduced instruction set computing (RISC) architectures. General purpose processor 210 may also include a processor architecture similar to the x86 architecture (e.g., a processor architecture commonly available in a microprocessor module). It should be appreciated that the described architectures for general purpose processor 210 may be similar to a large state machine, according to one embodiment.

General purpose processor 210 may include a plurality circuits for processing signals (e.g., signals such as user instructions and the calibration test outputs). In one instance, general purpose processor 210 may include, for example, arithmetic logic units (ALUs), a plurality of registers, and address generators. General purpose processor 210 may also include circuit modules, for example, JTAG modules, to transmit/receive signals. In one instance, a user may communicate (using computer code) with general purpose processor 210 through the JTAG module. Therefore, in this instance, the user instructions to calibrate analog circuits 120 may be received by general purpose processor 210 through the JTAG module. It should be appreciated that the computer code (usually in a high-level programming language such as C/C++) may be translated into machine language. In one instance, the user instructions received by general purpose processor 210 may be written in or translated to a machine language that follows a standard instruction set architecture (ISA) with 32-bit instructions.

It should be appreciated that general purpose processor 210 such as the NIOS II processor may be referred to as a soft-core processor (e.g., a processor implemented using programmable logic elements). Alternatively, general purpose processor 210 such as the ARM processor may be referred to as a hard-core processor (e.g., a processor implemented using fixed-function circuits). Implementing a soft-core processor or a hard-core processor for general purpose processor 210 may depend on various design factors (e.g., processing speed requirements and power consumption requirements).

The soft-core processor and the hard-core processor for general purpose processor 210 may be implemented as non-reconfigurable circuits (i.e., the processor architecture may not be altered even when different calibration test inputs are required). It should be appreciated that the soft-core processor, implemented with a plurality of programmable logic elements, may be reconfigured to generate different calibration test inputs. In other instances, the soft-core processor architecture remains fixed.

Different calibration test inputs may be generated by providing different user instructions (e.g., computer code) to general purpose processor 210. It should be appreciated that the user instructions described herein are different from reconfiguration instructions provided to general purpose processor 210 when general purpose processor 210 is implemented as a soft-core processor. The differences between the user instructions and the reconfiguration instructions may be that the former may generate different calibration test inputs using the existing processor architecture whereas the latter may generate different calibration test inputs by changing the processor architecture.

It should be appreciated that computer code may include, for example, instructions and data which cause a general purpose processor to perform a certain function or groups of functions. Computer code may also include program modules that are executed by stand-alone computers or computers connected in a network. Generally, program modules may include routines, programs, objects, components, and data structures, etc. that perform specific tasks or implement specific abstract data types. Computer code, its associated data structures, and program modules may represent means for executing all or at least a portion of the steps in the methods disclosed herein.

Still referring to FIG. 2, general purpose processor 210 is coupled to general bus 220. General bus 220 provides a transmission path to transfer signals across various circuits in integrated circuit 200. General bus 220 may transfer data in a bidirectional manner through the transmission path between the circuits that are coupled to general bus 220. In one instance, general bus 220 may be an intermediary circuit for transferring the calibration test inputs from general purpose processor 210 to analog circuit 120. Alternatively, general bus 220 may also be an intermediary circuit for transferring the calibration test outputs from analog circuit 120 to general purpose processor 210. General bus 220, in one embodiment, may be implemented with programmable routing fabric. The programmable routing fabric allows flexibility in terms of implementation of general bus 220 depending on different design requirements.

General bus 220 may also be coupled to other circuits in integrated circuit 200. In one instance, the additional circuits coupled to general bus 220 may be utilized for expanding the capability of general purpose processor 210. For example, general purpose processor 210 may increase its overall memory storage capacity when general bus 220 is coupled to a memory module. Therefore, general bus 220 provides significant flexibility in terms of calibrating analog circuit 120 without modifying the processor architecture of general purpose processor 210.

General bus 220 may follow a standard bus design (e.g., AVALON bus design, Advanced Microcontroller Bus Architecture (AMBA) bus design or AMBA high-performance bus (AHB) design). In one instance, the design of general bus 220 may depend on what type of processor general purpose processor 210 is. For example, general bus 220 may be similar to an AVALON bus design when general purpose processor 210 has a similar processor architecture to the NIOS II architecture. Alternatively, general bus 220 may be similar to the AMBA/AHB bus design when general purpose processor 210 has a similar processor architecture to the ARM architecture.

General bus 220 may also follow other standards such as Motorola processor busses, but is not limited to Motorola's RapidIO, which is a high speed serial, high-performance, packet-switched, interconnect technology. In another instance, general bus 220 may follow the standard of Xilinx Microblaze microprocessor busses that includes, but not limited to, Fast Simplex Link (FSL), On-chip Peripheral Bus (OPB), Local Memory Bus (LMB), etc. Alternatively, general bus 220 may follow the standard Xilinx PowerPC microprocessor busses that includes, but not limited to, On-chip Peripheral Bus (OPB), Processor Local Bus (PLB), Device Control Register (DCR) bus. In one instance, general bus 220 may follow the standard of Latice Micro32 open IP microprocessor core bus that includes, but not limited to, Wishbone which is a common open Intellectual Property (IP) core interface over a second system or device which is operating a UWB over narrowband wireless communications system.

Still referring to FIG. 2, PMA circuits 240 in analog circuit 120 are coupled to general bus 220 through interconnects 140. PMA circuits 240 may transmit signals out of integrated circuit 200 and may receive signals transmitted to integrated circuit 200. PMA circuits 240 may include a plurality of sub-circuits that provides flexibility to analog circuit 120 to transmit/receive signals through various protocols (e.g., Peripheral Computer Interface (PCI) Express protocol and Ethernet protocol). The sub-circuits in PMA circuits 240 may include various circuits such as equalizer circuitry, phase-locked loop (PLL) circuitry and serializer/deserializer (SERDES) circuitry.

PMA circuits 240 may receive all of the bits in general bus 220. In one instance, each PMA circuit 240 may receive fifty parallel bits from general bus 220 when general bus 220 is an AVALON bus. Hence, there may be fifty parallel signal routing connections within interconnects 140 that couple general bus 220 to PMA circuits 240. Even though there are three PMA circuits 240 in analog circuit 120 as shown in FIG. 2, it should be appreciated that fewer or more PMA circuits 240 may be included in analog circuit 120, depending on different design requirements. Having more PMA circuits 240 in analog circuit 120 may significantly increase the design complexity as there may be a large number of signal routing connections for interconnects 140.

In one embodiment, PMA circuits 240 may receive the calibration test inputs from general bus 220. The calibration test inputs may test different offsets on the circuits within PMA circuits 240 (e.g., timing offsets, phase offsets, amplitude offsets or voltage offsets for signal transfer in PMA circuit 240). Accordingly, calibration test outputs are generated from respective PMA circuits 240. The calibration test outputs may be stored within registers (not shown) that are coupled to the PMA circuits 240. In one embodiment, the registers may serve as a memory block. Subsequently, the calibration test outputs may then be transferred to general purpose processor 210 through general bus 220.

Figure 3:
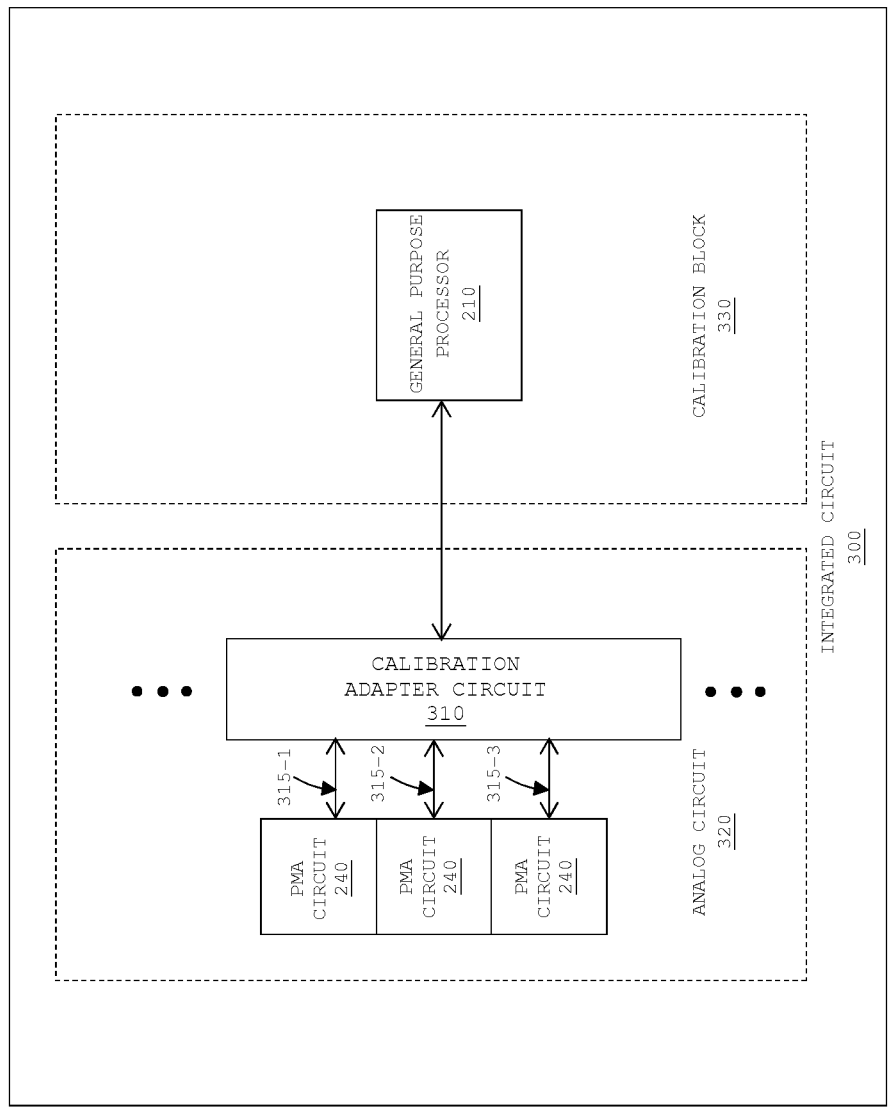

FIG. 3, meant to be illustrative and not limiting, depicts another implementation of a calibration system on an integrated circuit in accordance with one embodiment of the present invention. Integrated circuit 300 may be similar to integrated circuit 100 of FIG. 1 and integrated circuit 200 of FIG. 2. Calibration block 330 may include general purpose processor 210, whereas analog circuit 320 may include PMA circuits 240 and calibration adapter circuit 310.

Calibration adapter circuit 310, unlike general bus 220 of FIG. 2, may be a bus circuit that is used only for calibration purposes. In one embodiment, calibration adapter circuit 310 may include fewer transmission paths compared to general bus 220 of FIG. 2. For example, calibration adapter circuit 310 can include a predetermined number of transmission paths for transmitting the calibration signals and calibration test outputs needed to calibrate analog circuit 320 in accordance with the calibration technique being used to calibrate the PMA circuits 240. For example, calibration adapter circuit 310 may include 28 transmission paths to transfer 28 parallel signal bits (i.e., significantly fewer paths compared to transferring the 50 signal bits on general bus 220 of FIG. 2). Therefore, calibration adapter circuit 310 may require significantly less area on integrated circuit 300 compared to general bus 220 on integrated circuit 200 of FIG. 2. It should be appreciated that calibration adapter circuit 310 may implement a standard bus protocol such as the AVALON protocol, AMBA protocol and the AHB protocol. However, each of these protocols may be modified based on the actual number of circuits in analog circuit 320.

In FIG. 3, the calibration test inputs received from general purpose processor 210 are transmitted to PMA circuits 240 through signal pathways (e.g., signal pathways 315-1 to 315-3) that may be coupled to calibration adapter circuit 310. Once the calibration of the respective PMA circuits 240 is completed, calibration adapter circuit 310 may transfer the calibration test outputs to general purpose processor 210. It is noted that even though only one calibration adapter circuit is shown in FIG. 3, alternative embodiments (not shown) can include more than one calibration adapter circuit. For example, different calibration adapter circuits can be used for different calibration techniques, or for different target sub-circuits of the PMA circuits.

Figure 4:
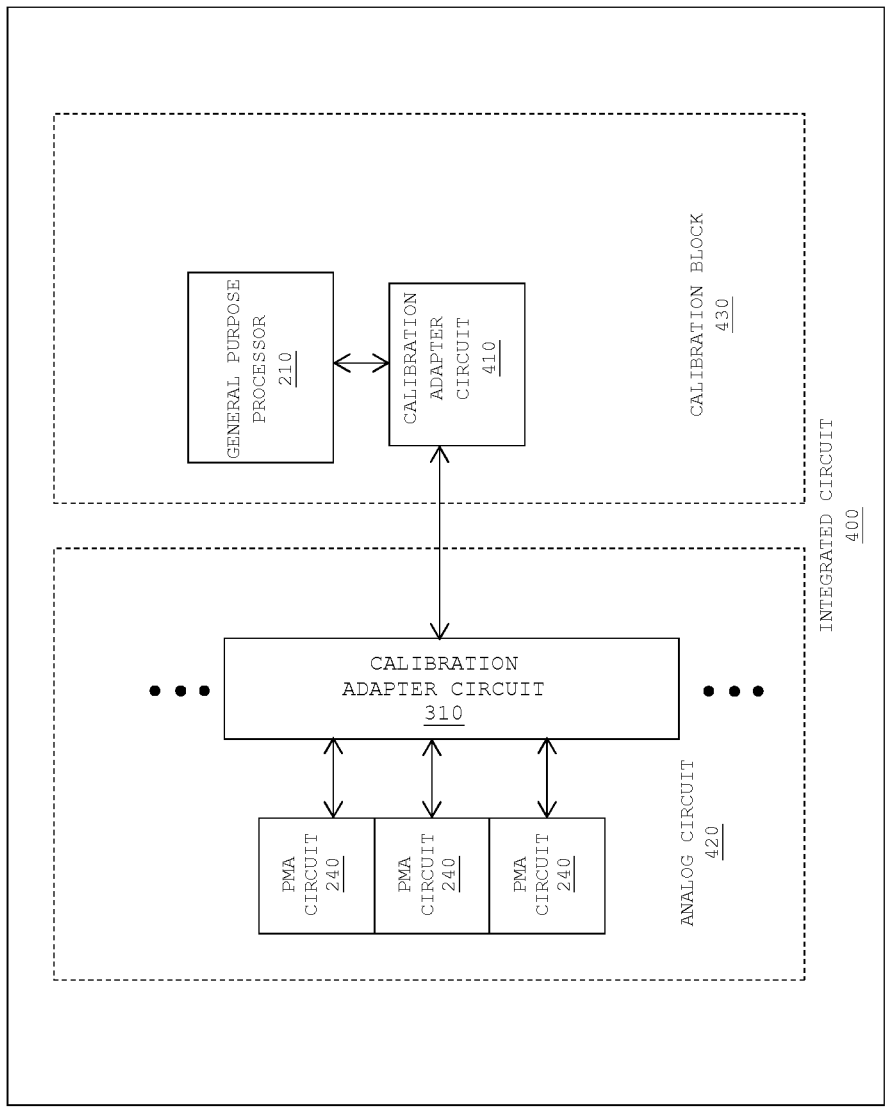
FIG. 4 shows an illustrative calibration system with a calibration adapter circuit in accordance with one embodiment of the present invention.

FIG. 4, meant to be illustrative and not limiting, shows a calibration system with a calibration adapter circuit within a calibration block in accordance with one embodiment of the present invention. In the embodiment of FIG. 4, calibration block 430 may include calibration adapter circuit 410. Calibration adapter circuit 410 within calibration block 430 may provide an interfacing capability between two blocks of circuit with different protocols. In FIG. 4, to support the interfacing capability, calibration adapter circuit 410 may convert the number of bits for data following a bus protocol to a different number of bits for data following another bus protocol. In one exemplary embodiment, calibration adapter circuit 410 may convert data having 50 bits (in a standard AVALON protocol) on general purpose processor 210 to data having only 28 bits (following a variation of standard AVALON protocol) on calibration adapter circuit 310. As another example, calibration adapter circuit 410 may also convert data from data having 28 bits (following a variation of standard AVALON protocol) on calibration adapter circuit 310 to data having 50 bits (following a standard AVALON protocol) on general purpose processor 210.

PMA circuits 240, general purpose processor 210 and calibration adapter circuit 310 are similar to those described in FIGS. 2-3 and will not be repeated in here again.

Figure 5:
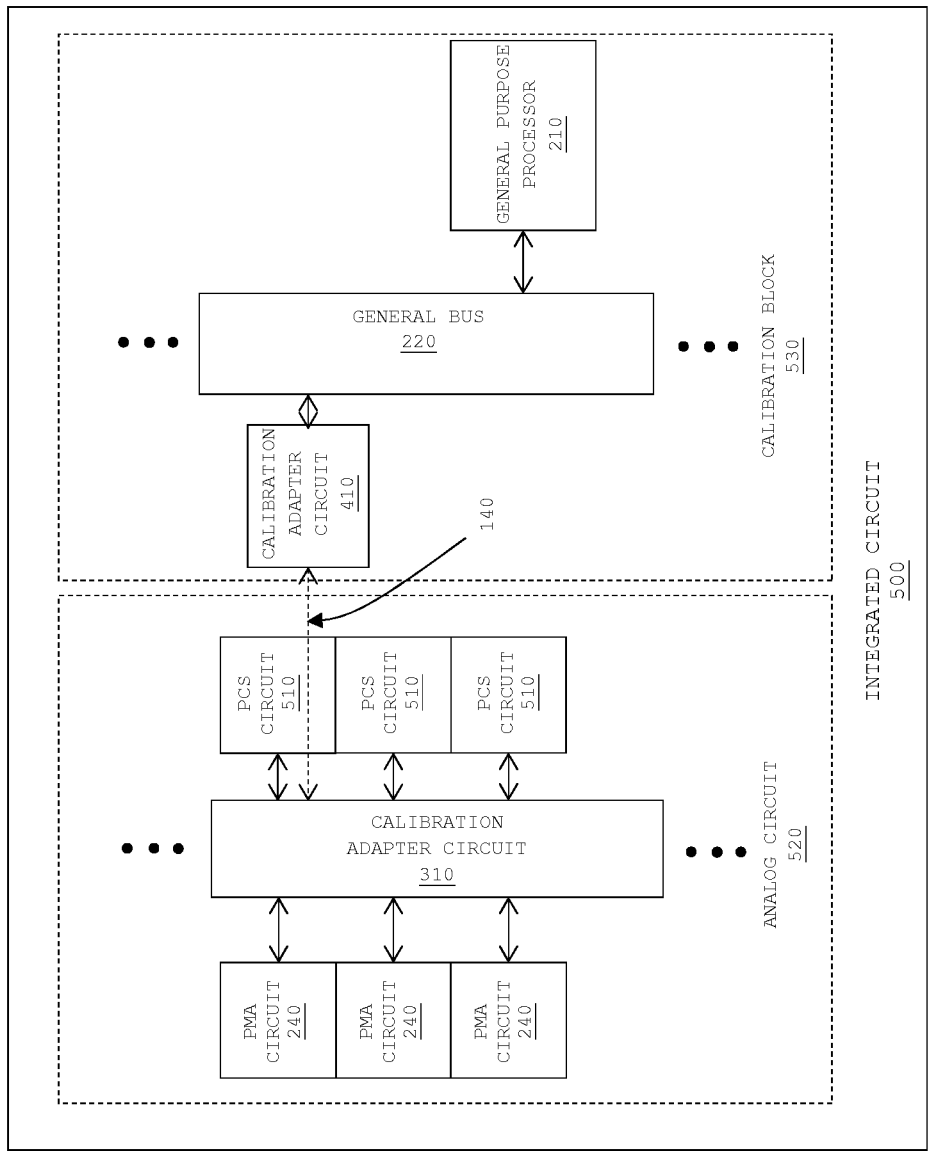
FIG. 5 shows an illustrative calibration system with an analog circuit with physical coding sublayer (PCS) circuits in accordance with one embodiment of the present invention.

FIG. 5, meant to be illustrative and not limiting, illustrates a calibration system with an analog circuit that includes physical coding sublayer (PCS) circuits in accordance with one embodiment of the present invention. Integrated circuit 500 may be similar to integrated circuit 200, 300, or 400 of FIGS. 2-4, respectively. It should be appreciated that both PCS circuits 510 and PMA circuits 240 function to transmit a signal in or out from integrated circuit 500. Generally, PCS circuits 510 include a plurality of analog sub-circuits. By having a calibration system as shown within integrated circuit 500, PCS circuits 510 may be calibrated. In one embodiment, PCS circuits 510 may include sub-circuits to support various protocols such as the PCI Express, Ethernet, Interlaken and 10 Gigabit Attachment Unit Interface (XAUI) protocols. Sub-circuits in PCS circuits 510 may include, for example, first-in-first-out (FIFO) registers, scramblers and descramblers, encoders and decoders.

Referring still to FIG. 5, PCS circuits 510 may be coupled to calibration adapter circuit 310. PCS circuits 510 may receive signals from calibration adapter circuit 310. In one embodiment, PCS circuits 510 may be calibrated in a similar manner as PMA circuits 240.

The calibration test inputs may be generated by circuit elements within calibration block 530. In one instance, the calibration test inputs may be generated by general purpose processor 210, and then are transmitted to PCS circuits 510 via general bus 220, calibration adapter circuit 410, interconnects 140 and calibration adapter circuit 310. Similarly, the calibration test outputs, generated after the calibration of PCS circuits 510, may be transmitted to general purpose processor 210 through calibration adapter circuit 310, interconnects 140, calibration adapter circuit 410 and general bus 220. It should be appreciated even though three PCS circuits 510 are shown in the embodiment of FIG. 5, fewer or more PCS circuits may be included in analog circuit 120, depending on different design requirements.

Figure 6:
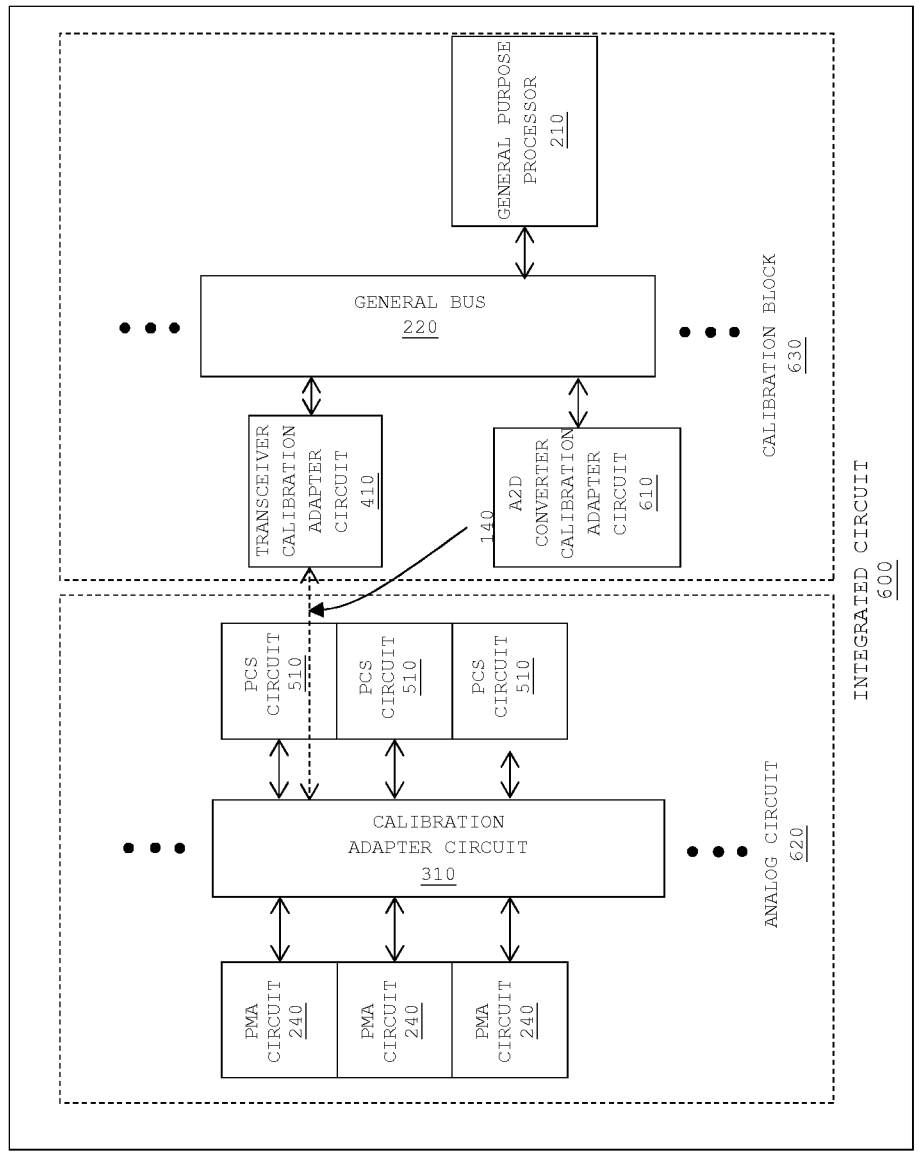
FIG. 6 shows an implementation of an analog-to-digital (A2D) calibration system within an integrated circuit in accordance with one embodiment of the present invention.

FIG. 6, meant to be illustrative and not limiting, illustrates an implementation of analog-to-digital (A2D) calibration system within an integrated circuit in accordance with one embodiment of the present invention. Integrated circuit 600 may be capable of performing functions similar to integrated circuit 500 of FIG. 5. Furthermore, integrated circuit 600 may also be capable of performing an A2D calibration. Therefore, integrated circuit 600 may include circuits similar to integrated circuit 500 of FIG. 5 with an additional A2D calibration adapter 610 within calibration block 630.

In one instance, A2D calibration adapter 610 may be utilized to calibrate A2D circuits (not shown) within integrated circuit 600. A2D calibration adapter 610, may receive calibration test inputs from general bus 220 following a standard protocol (e.g., AVALON bus design, AMBA bus design or AHB bus design) and may convert the calibration test inputs to a specific protocol used by the targeted circuitry (not shown). A2D calibration adapter 610 may also receive calibration test outputs (generated after the calibration of A2D circuitry) and may further convert the calibration test outputs to a protocol that conforms to the protocol used in general bus 220.

Figure 7:
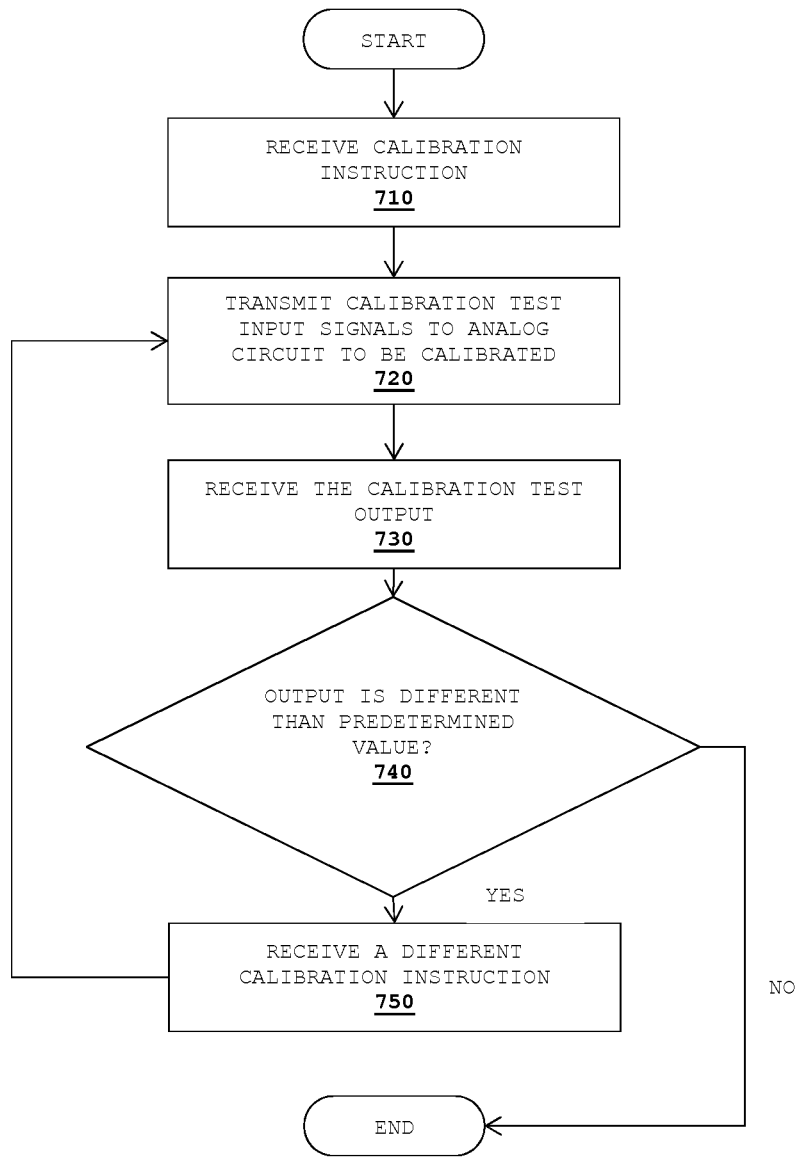
FIG. 7 is a flow chart of illustrative steps for calibrating an analog circuit within an integrated circuit utilizing a general purpose processor in accordance with one embodiment of the present invention.

FIG. 7, meant to be illustrative and not limiting, illustrates steps for calibrating an analog circuit on an integrated circuit using a general purpose processor in accordance with at least one embodiment of the present invention. The integrated circuit may be similar to either or integrated circuit 100, 200, 300, 400, 500 or 600 of respective FIGS. 1-6. The analog circuit may be similar to analog circuits 120 of FIGS. 1-6. At step 710 a calibration instruction is received. The calibration instruction may be a user instruction that is received from a general purpose processor. The general purpose processor may be similar to general purpose processors 210 of FIGS. 2-6. The calibration instruction from the user may be received by the general purpose processor through different user interfaces (e.g., a JTAG interface). The calibration instruction may be computer code that is written in a programming language such as C/C++. The general purpose processor may generate a calibration test input (e.g., similar to calibration test inputs referred in FIGS. 2-6).

At step 720, calibration test inputs may be transmitted to the analog circuit being calibrated via various transfer mechanisms. In one embodiment, the transfer mechanism may be similar to one of the transfer mechanisms shown in FIGS. 2-6. For example, in FIG. 2, calibration test outputs may be transferred to analog circuit 120 through general bus 220 and interconnects 140. At step 720, the analog circuit may be calibrated. It should be appreciated that the analog circuit may be calibrated to minimize or substantially eliminate offsets on the signals that are transmitted by the analog circuit. Some of the different offsets may include, for example, timing offsets, phase offsets, amplitude offsets and voltage offsets. In one embodiment, the calibrate analog circuit operation at step 720 may refer to a calibration operation performed on PMA circuits 240 of FIGS. 2-6. In another embodiment, the calibration operation may also include the calibration of PCS circuits 510 of FIG. 5.

In response to the calibration test input the analog circuit may generate a calibration test output. At step 730, the calibration test output is received. In one embodiment, the general purpose processor may receive the calibration test output can be received via various transfer mechanisms such as those shown in FIGS. 2-6. Once the calibration test output is received by the general purpose processor the general purpose processor may determine whether the calibration test output is different from a predetermined value at step 740.

In one instance, the calibration of the analog circuit is complete when the calibration test output is similar to the predetermined value. However, when the calibration test output is different from the predetermined value, then the method proceeds to step 750. At step 750, a different calibration instruction may be received from the general purpose processor. In one instance, the calibration instruction received at step 750 may be different from the earlier computer code received at step 710. The different calibration instruction may generate a different calibration test input. However, the calibration instruction received at step 750 may not change the architecture of the general purpose processor.

After receiving a different calibration instruction, steps 720, 730 and 740 may be repeated with the newly received calibration instruction. In one embodiment, the steps in FIG. 7 may be repeated until the calibration test output is equal to the predetermined value.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit, comprising:
   a general purpose processor circuit on the integrated circuit that generates a test input and an address signal after receiving an instruction to perform calibration; and
   an analog interface circuit on the integrated circuit that receives the test input from the general purpose processor, that routes the test input to a physical medium attachment circuit identified by the address signal, and that generates a corresponding test output, wherein the analog interface circuit includes a bus circuit used only for calibration.

2. The integrated circuit defined in claim 1, wherein the general purpose processor circuit comprises a non-reconfigurable circuit.

3. The integrated circuit defined in claim 1, wherein the analog interface circuit comprises a transceiver circuit that transmits signals out of the integrated circuit and that receives signals from external circuitry.

4. The integrated circuit in defined claim 1, wherein the analog interface circuit comprises the physical medium attachment (PMA) circuit and the physical medium attachment circuit receives the test input and outputs the test output based on the test input.

5. The integrated circuit defined in claim 1, wherein the bus circuit includes 28 transmission paths to transfer 28 parallel signal bits.

6. The integrated circuit defined in claim 1, wherein the bus circuit includes less than 50 transmission paths to transfer less than 50 parallel signal bits.

7. The integrated circuit defined in claim 4, wherein the bus circuit conveys the test signal from the general purpose processor circuit to the physical medium attachment circuit, and wherein the bus circuit further conveys the test output from the physical medium attachment circuit to the general purpose processor circuit.

8. An integrated circuit, comprising:
a general purpose processor circuit on the integrated circuit that generates a calibration test input after receiving an instruction to perform calibration; and
an analog interface circuit on the integrated circuit comprising:
 a calibration adapter circuit that implements a bus protocol and that receives the calibration test input from the general purpose processor circuit, wherein the calibration adapter circuit is a bus circuit that is used only for calibration purposes; and
 a physical medium attachment circuit that receives the calibration test input from the calibration adapter circuit.

9. The integrated circuit defined in claim 8, further comprising:
a register coupled between the calibration adapter circuit and a circuit in the analog interface circuit, wherein the register stores a calibration test output of the circuit.

10. The integrated circuit defined in claim 8, wherein the calibration adapter circuit is further coupled to the other circuits in the analog interface circuit, wherein the other circuits are selected from one of: a Physical Coding System (PCS) circuit, a Dynamic Partial Reconfiguration Input/output (DPRIO) circuit and a Pipeline circuit.

11. The integrated circuit defined in claim 8, wherein the calibration adapter circuit includes 28 transmission paths to transfer 28 parallel signal bits.

12. The integrated circuit defined in claim 8, wherein the calibration adapter circuit includes less than 50 transmission paths to transfer less than 50 parallel signal bits.

\* \* \* \* \*